(12) United States Patent
Matsumoto et al.

(10) Patent No.: US 9,019,787 B2
(45) Date of Patent: Apr. 28, 2015

(54) SEMICONDUCTOR DEVICE HAVING HIERARCHICAL BIT LINE STRUCTURE

(71) Applicant: PS4 Luxco S.A.R.L., Luxembourg (LU)

(72) Inventors: Yasuhiro Matsumoto, Tokyo (JP); Noriaki Mochida, Tokyo (JP); Takeshi Ohgami, Tokyo (JP); Daiki Izawa, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 160 days.

(21) Appl. No.: 13/888,707

(22) Filed: May 7, 2013

(65) Prior Publication Data
US 2013/0301330 A1 Nov. 14, 2013

(30) Foreign Application Priority Data
May 9, 2012 (JP) ................. 2012-107800

(51) Int. Cl.
| G11C 7/00 | (2006.01) |
| G11C 5/06 | (2006.01) |
| G11C 11/4074 | (2006.01) |
| G11C 11/4094 | (2006.01) |
| G11C 11/4097 | (2006.01) |
| G11C 11/4099 | (2006.01) |
| G11C 7/18 | (2006.01) |
| G11C 29/00 | (2006.01) |
| G11C 29/06 | (2006.01) |
| G11C 29/12 | (2006.01) |

(52) U.S. Cl.
CPC ............ *G11C 5/063* (2013.01); *G11C 11/4074* (2013.01); *G11C 11/4094* (2013.01); *G11C 11/4097* (2013.01); *G11C 11/4099* (2013.01); *G11C 7/18* (2013.01); *G11C 29/006* (2013.01); *G11C 29/06* (2013.01); *G11C 2029/1204* (2013.01)

(58) Field of Classification Search
USPC ....................... 365/203, 230.03, 201
See application file for complete search history.

(56) References Cited

U.S. PATENT DOCUMENTS

2006/0109732 A1* 5/2006 Fujimoto ................. 365/230.03
2009/0190415 A1* 7/2009 Kim .......................... 365/189.14

FOREIGN PATENT DOCUMENTS

JP 2011-154754 A 8/2011

* cited by examiner

*Primary Examiner* — Vu Le

(57) ABSTRACT

A semiconductor device having hierarchical bit lines is disclosed, which comprises: a first global bit line; first and second local bit lines coupled in common to the first global bit line; first and second power lines; a first transistor coupled between the first local bit line and the first power line; a second transistor coupled between the second local bit line and the second power line; a third transistor coupled between the first and second power lines.

20 Claims, 7 Drawing Sheets

SEMICONDUCTOR DEVICE HAVING HIERARCHICAL BIT LINE STRUCTURE

BACKGROUND OF THE INVENTION

1. Field of the Invention

The present invention relates to a semiconductor device comprising a memory cell array in which bit lines are hierarchized.

2. Description of Related Art

In recent years, semiconductor devices such as DRAM have increased in capacity and decreased in size, and with this, memory cell arrays in which bit lines are hierarchized into global bit lines and local bit lines tend to be used. In such memory cell arrays, a plurality of local bit lines are arranged corresponding to each one of the global bit lines, and a plurality of memory cells are arranged corresponding to each of the local bit lines, thereby shortening the line length of each of the local bit lines. Further, by providing many hierarchical switches that control electrical connections between the global bit line and the local bit lines, data of a selected memory cell can be transmitted from one of the local bit lines to the global bit line through a hierarchical switch. For example, Patent Reference 1 discloses a specific example of a semiconductor device comprising a memory cell array having a hierarchical bit line structure.

[Patent Reference 1] Japanese Patent Application Laid-open No. 2011-154754

In the semiconductor devices that have decreased in size, it is generally desirable to sufficiently remove initial failure by applying voltage stresses to the memory cell array at a stage of a wafer test before product shipment. The voltage stresses can be applied to the above-described hierarchical memory cell array by utilizing precharge transistors provided on the local bit lines so as to supply a desired potential in a state where all hierarchical switches are turned off. For example, assuming a configuration of the semiconductor device disclosed in the Patent Reference 1, two adjacent local bit lines along an extending direction of one global bit line are electrically isolated from each other with a short distance, and thereby it is particularly important to expose the failure occurring in manufacturing processes by applying a voltage stress between them. However, restriction of circuit configuration shown in the Patent Reference 1 makes it difficult to supply potentials different from each other to the two adjacent local bit lines along the extending direction of the one global bit line. In this manner, the above conventional hierarchical memory cell array poses a problem that the voltage stress cannot be effectively applied between the adjacent local bit lines by the test before product shipment.

SUMMARY

One of aspects of the invention is a semiconductor device comprising: a first global bit line; first and second local bit lines coupled in common to the first global bit line; first and second power lines; a first transistor coupled between the first local bit line and the first power line; a second transistor coupled between the second local bit line and the second power line; and a third transistor coupled between the first and second power lines.

Another aspect of the invention is a device comprising: a first global bit line; first and second local bit lines coupled in common to the first global bit line; a first precharge circuit configured to supply a first precharge voltage to the first local bit line; a second precharge circuit configured to supply a second precharge voltage to the second local bit line; and a precharge voltage generator configured to make the different level from each other.

DETAILED DESCRIPTION OF THE PREFERRED EMBODIMENTS

Embodiments of the present invention will be described in detail below with reference to accompanying drawings. In the following embodiments, the present invention will be applied to DRAM (Dynamic Random Access Memory) having a hierarchical bit line structure as an example of a semiconductor device.

Figure 1:
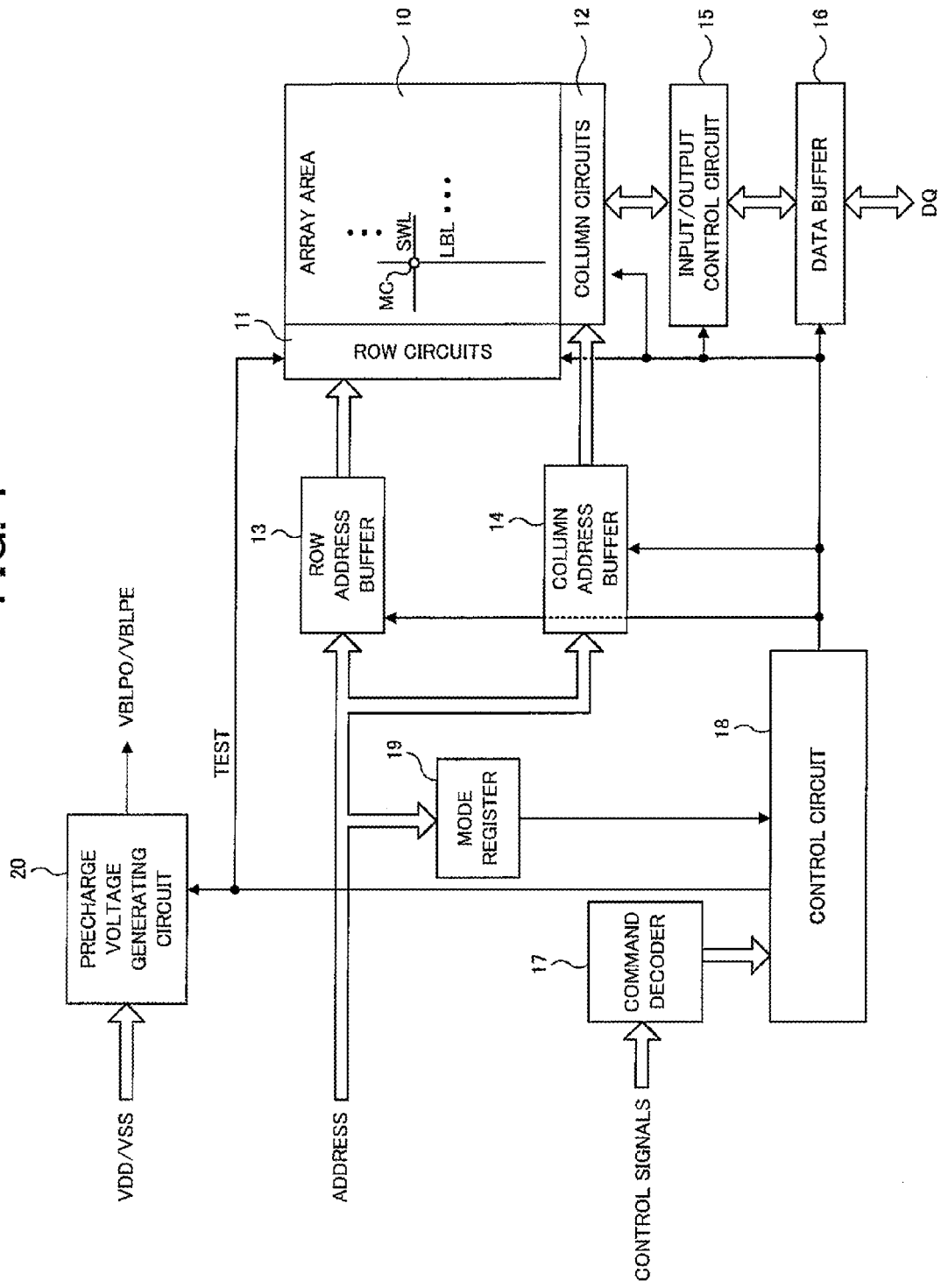
FIG. 1 is a block diagram showing an entire configuration of DRAM of an embodiment.

FIG. 1 is a block diagram showing an entire configuration of the DRAM of an embodiment. The DRAM shown in FIG. 1 comprises an array area 10 including a plurality of memory cells MC, a row circuit area 11 and a column circuit area 12 that are attached to the array area 10, and their peripheral circuits. Bit lines of the array area 10 are hierarchized into global bit lines (FIG. 4) of an upper hierarchy and local bit lines LBL of a lower hierarchy, and the plurality of memory cells MC are arranged at intersections of the local bit lines LBL and a plurality of hierarchical word lines (sub-word lines SWL in FIG. 1). The row circuit area 11 includes many circuits provided corresponding to the hierarchical word lines, and the column circuit area 12 includes many circuits provided corresponding to the hierarchical bit lines.

A row address buffer 13 stores a row address of an externally input address and sends it to the row circuit area 11, and a column address buffer 14 stores a column address of the externally input address and sends it to the column circuit area 12. An input/output control circuit 15 controls data transfer between the column circuit area 12 and a data buffer 16. The data buffer 16 inputs/outputs the data transferred by the input/output control circuit 15 from/to outside via input/output data terminals DQ. A command decoder 17 determines a command for the DRAM based on externally input control signals and sends the command to a control circuit 18.

The control circuit 18 controls operations of respective parts of the DRAM in accordance with a command type determined by the command decoder 17. Further, the control circuit 18 controls operations of the array area 10 and its peripheral circuits, and sends control signals to the respective parts of the DRAM. A mode register 19 selectively sets operation modes of the DRAM based on the above address, and sends setting information to the control circuit 18. Furthermore, the control circuit 18 controls test operations of the DRAM in accordance with test commands from outside, and generates a test signal TEST used in the test operations so as to send it to a precharge voltage generating circuit 20 and the row circuit area 11. Specific test operations based on the test signal TEST will be described later.

Figure 2:
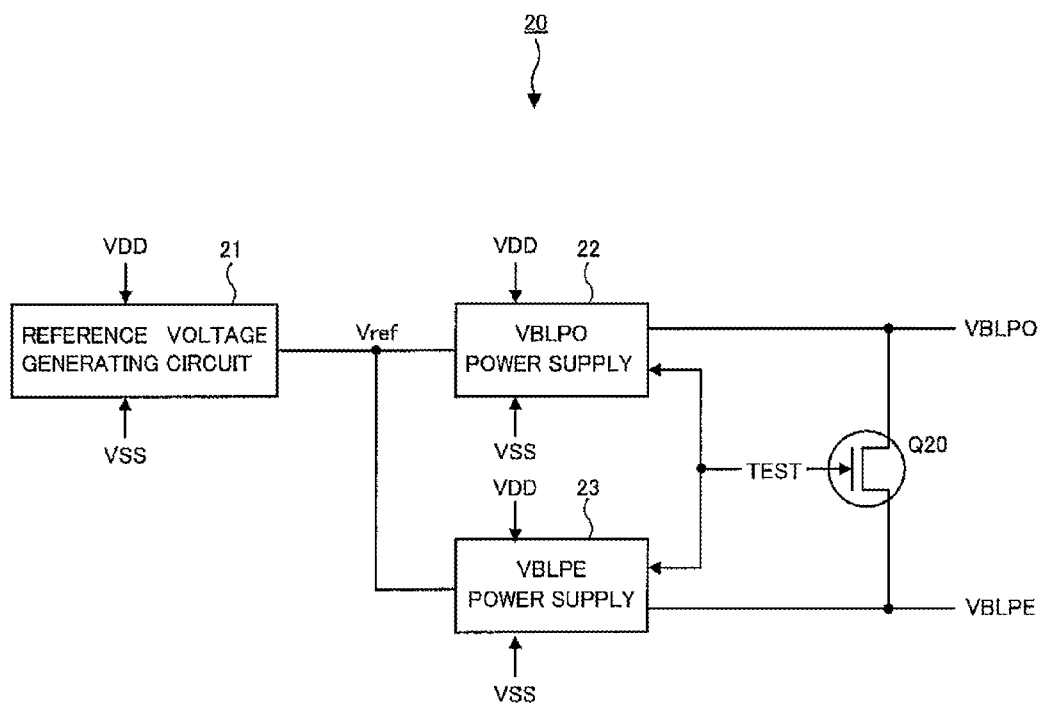
FIG. 2 is a block diagram showing a configuration of a precharge voltage generating circuit of FIG. 1.

Meanwhile, the precharge voltage generating circuit 20 generates a pair of precharge voltages VBLPE/VBLPO that are used in a later-described precharge operation. Here, the block diagram of FIG. 2 shows a configuration example of the precharge voltage generating circuit 20. As shown in FIG. 2, the precharge voltage generating circuit 20 includes a reference voltage generating circuit 21, a VBLPO power supply 22, a VBLPE power supply 23, and a P-channel type transistor Q20. The precharge voltage generating circuit 20 operates with a power supply voltage VDD and a ground potential VSS that are supplied from outside.

The reference voltage generating circuit 21 generates a reference voltage Vref by using the power supply voltage VDD and the ground potential VSS, and the reference voltage Vref is used as a reference for voltage levels of the precharge voltages VBLPO and VBLPE. The VBLPO power supply 22 and the VBLPE power supply 23 generate the respective precharge voltages VBLPO and VBLPE to be supplied to the hierarchical bit lines by using the reference voltage Vref, the power supply voltage VDD and the ground potential VSS. Operations of the VBLPO power supply 22 and the VBLPE power supply 23 are controlled in response to the test signal TEST. Further, the transistor Q20 functions as a switch for controlling connection states between output nodes of the VBLPO power supply 22 and the VBLPE power supply 23 in response to the test signal TEST applied to its gate.

In a normal operation, the test signal TEST is set to a low level, and the transistor Q20 is turned on so that the outputs nodes of the VBLPO power supply 22 and the VBLPE power supply 23 are short-circuited. At this point, each of the VBLPO power supply 22 and the VBLPE power supply 23 outputs a precharge voltage Vpre that is substantially the same as the reference voltage Vref, thereby outputting VBLPE=VBLPO=Vpre, respectively. On the other hand, in a test operation, the test signal TEST is set to a high level, and the transistor Q20 is turned off so that the outputs nodes of the VBLPO power supply 22 and the VBLPE power supply 23 are disconnected from each other. At this point, each of the VBLPO power supply 22 and the VBLPE power supply 23 outputs either one of the power supply voltage VDD and the ground potential VSS as the precharge voltage VBLPE or VBLPO.

Figure 3:
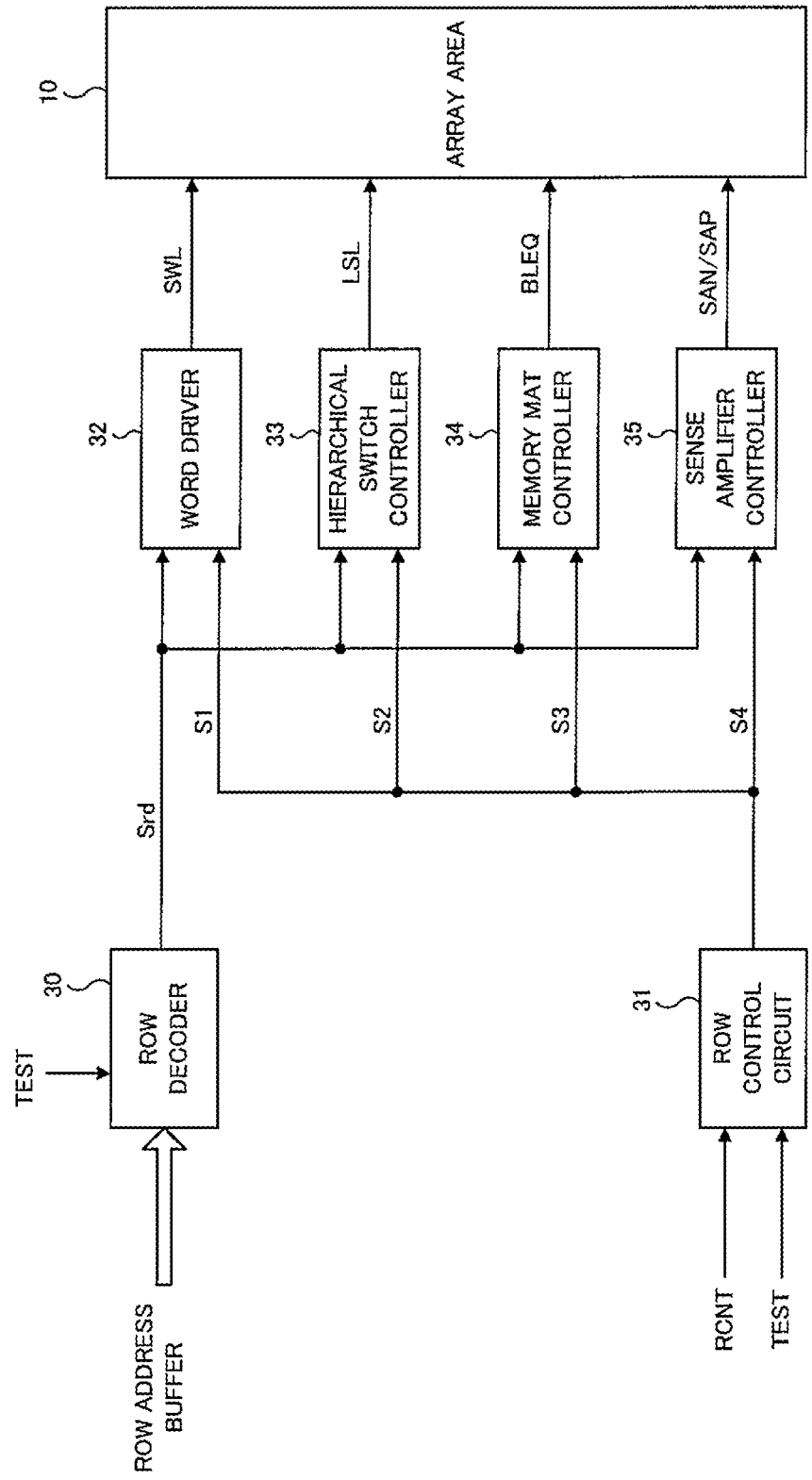
FIG. 3 is a block diagram showing a principal part of the DRAM of the embodiment.

Next, FIG. 3 is a block diagram showing a principal part of the DRAM of FIG. 1. FIG. 3 shows a region mainly associated with operations of the row circuit area 11 of FIG. 1, which includes the array area 10, a row decoder 30, a row control circuit 31, a word driver 32, a hierarchical switch controller 33, a memory mat controller 34, and a sense amplifier controller 35. In the above configuration, the row decoder 30 decodes the row address sent from the row address buffer 13, and generates row decoded signals Srd including a plurality of decoded signals corresponding to the hierarchical structure of the array area 10. The plurality of decoded signals included in the row decoded signals Srd are corresponded to a plurality of memory mats M (FIG. 4) included in the array area 10. In each of the memory mat M, each decoded signal activates a set of sub-word lines SWL, a set of hierarchical switches, a set of sense amplifiers, and a set of precharge circuits, and a specific configuration thereof will be described later. In the normal operation, one decoded signal of the row decoded signals Srd becomes enabled, and one memory mat M corresponding to the one decoded signal is selectively activated. On the other hand, in the test operation, all decoded signals of the row decoded signals Srd becomes enabled in response to the test signal TEST, and the plurality of memory mats M are activated.

The row control circuit 31 controls the word driver 32, the hierarchical switch controller 33, the memory mat controller 34 and the sense amplifier controller 35, respectively. The row control circuit 31 receives a row control signal RCNT and the test signal TEST from the control circuit 18 (FIG. 1), and generates a main word control signal S1 supplied to the word driver 32, a main switch control signal S2 supplied to the hierarchical switch controller 33, a memory mat control signal S3 supplied to the memory mat controller 34, and a sense amplifier control signal S4 supplied to the sense amplifier controller 35, respectively, based on the received signals.

The word driver 32 selects a hierarchical word line in the array area 10 in accordance with the row decoded signals Srd. In the normal operation, one main word line MWL (FIG. 4) in one sub-mat SM (FIG. 4) in one memory mat M in the array area 10 is selected, and one set of a plurality of sets of sub-word lines SWL (FIG. 4) corresponding to the selected main word line MWL is selected. In the test operation, all main word lines MWL and all sub-word lines SWL in the array area 10 are selected.

The hierarchical switch controller 33 controls connection states of the respective hierarchical switches in the array area 10 in accordance with the row decoded signals Srd. In the normal operation, a plurality of hierarchical switches included in the selected sub-mat SM are rendered conductive, and other hierarchical switches are rendered non-conductive. In the test operation, all hierarchical switches in the array area 10 are rendered non-conductive.

The memory mat controller 34 supplies a bit line equalizing signal BLEQ for controlling a later-described precharge operation in each memory mat M in the array area 10 in accordance with the row decoded signals Srd. In the normal operation, a plurality of later-described precharge circuits included in at least the selected sub-mat SM are activated. In this case, it is desirable that a plurality of precharge circuits included in non-selected sub-mats SM are set in an inactive state. In the test operation, all precharge circuits in the array area 10 are set in an active state.

The sense amplifier controller 35 supplies a pair of sense amplifier control signals SAN/SAP for activating respective sense amplifiers SA in each sense amplifier array SAA (FIG. 4) in the array area 10 in accordance with the row decoded signals Srd. In the normal operation, the respective sense amplifiers SA included in at least sense amplifier arrays SAA on both sides of a selected memory mat M are activated. In the test operation, all sense amplifiers SA in the array area 10 are set in an inactive state.

Figure 4:
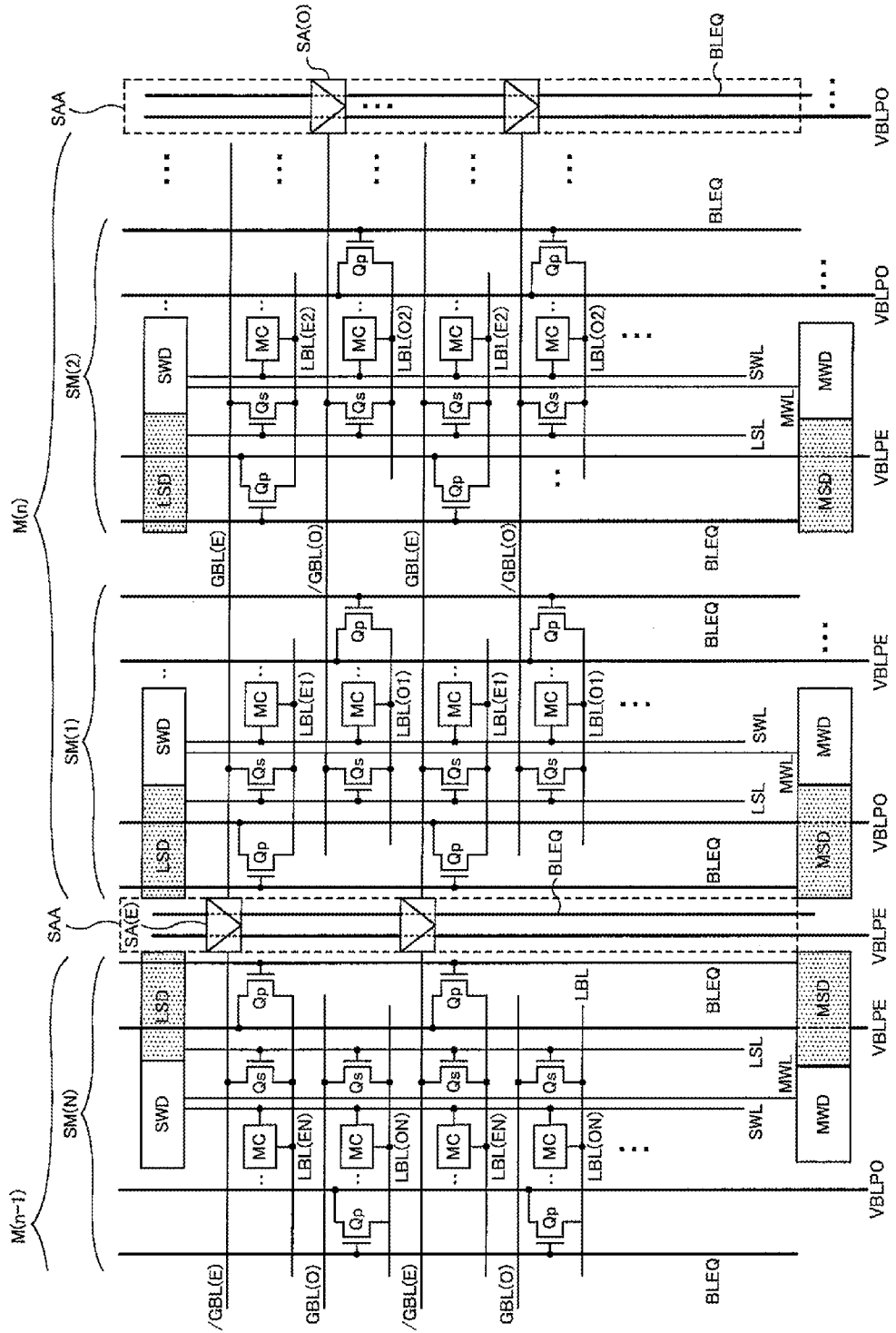
FIG. 4 is a diagram showing a partial configuration of an array area of FIG. 3.

Next, FIG. 4 is a diagram showing a partial configuration of the array area 10 of FIG. 3. FIG. 4 shows a configuration of one memory mat M(n) and its vicinity among the plurality of memory mats M in the array area 10. Sense amplifier arrays SAA each including a plurality of sense amplifiers SA are arranged on both sides of the memory mat M(n). As described above, the memory mat M(n) has the bit lines hierarchized into the global bit lines GBL and the local bit lines LBL. Further, the memory mat M(n) has an open bit line structure, in which a plurality of global bit lines GBL are alternately connected to respective sense amplifiers SA in the sense amplifier arrays SAA on the left and right sides in their arrangement order. The example of FIG. 4 shows sense amplifiers SA(E) in one sense amplifier array SAA, even-numbered global bit lines GBL(E) connected to the respective sense amplifiers SA(E), sense amplifiers SA(O) in the other sense amplifier array SAA, and odd-numbered global bit lines /GBL(O) connected to the respective sense amplifiers SA(O) to form complementary pairs thereof. Here, in the memory mat M(n) of FIG. 4, the uppermost global bit line GBL is assumed to be numbered 0 (even number), which is incremented by one downwardly.

A plurality of local bit lines LBL are arranged for each one of the global bit lines GBL, which are segmented along an extending direction of the global bit lines GBL. In this structure, a unit area segmented by each one of the local bit lines LBL forms one sub-mat SM. In the example of FIG. 4, there are shown a sub-mat SM(1) at a left end of the memory mat M(n), and a sub-mat SM(2) adjacent to the sub-mat SM(1) Further, there are shown local bit lines LBL(E1) and LBL (O1) alternately arranged in the sub-mat SM(1), and local bit lines LBL(E2) and LBL(O2) alternately arranged in the sub-mat SM(2), which correspond to the arrangement of the global bit lines GBL(E) and /GBL(O). For example, assuming that M global bit lines GBL are arranged in the memory mat M(n) and the memory mat M(n) is divided into N sub-mats SM(1) to SM(N), M×N local bit lines LBL are arranged in the memory mat M(n) in total. In this case, N local bit lines LBL arranged corresponding to each one of the global bit lines GBL in one memory mat M have the same length and extend on the same straight line.

Further, in FIG. 4, there are shown a sub-mat SM(N) at a right end of a memory mat M(n−1) on the left side of the memory mat M(n). The sub-mat SM(N) has a configuration common to the above sub-mats SM(1) and SM(2). Here, when attention is focused on a sense amplifier array SAA between the sub-mats SM(N) and SM(1), each sense amplifier SA(E) therein is connected to a complementary pair of one global bit line /GBL(E) in the memory mat M(n-1) on the left side and one global bit line GBL(E) in the memory mat M(n) on the right side. In this manner, each sense amplifier SA in FIG. 4 is configured to amplify a voltage difference between two global bit lines GBL on both sides and to output it as a determined result in binary. This configuration is common to respective sense amplifiers SA in all sense amplifier arrays SAA in the array area 10.

Further, word lines in the memory mat M(n) are hierarchized into main word lines MWL and sub-word lines SWL. Each of the main word lines MWL is connected to one main word driver MWD at its one end, and is connected to a plurality of sub-word drivers SWD. Each of the sub-word lines SWL is connected to a sub-word driver SWD at its one end, and memory cells MC are formed at intersections of a predetermined number of local bit lines LBL and the sub-word lines SWL. Each one of the local bit lines LBL is selectively coupled to a memory cell MC selected in accordance with the potential of the local bit line LBL among a plurality of memory cells MC. Each of the memory cells MC is composed of, for example, a selection transistor switched by the sub-word line SWL and a capacitor storing data as electric charge.

In the memory mat M(n), a switch transistor Qs functioning as a hierarchical switch is provided at one end of each of the local bit lines LBL. The switch transistor Qs controls a connection state between the global bit line GBL and the local bit line LBL in response to a potential of a local switch control line LSL connected to its gate. The local switch control line LSL is connected to a local switch driver LSD at its one end, and is connected to a predetermined number of switch transistors Qs. A main switch driver MSD is provided at an end of each of the sub-mats SM, and a main switch control line (not shown) is connected to the main switch driver MSD. The main switch control line is connected to a plurality of local switch drivers LSD, and one switch transistor Qs corresponding to one local switch driver LSD activated by the potential of the main switch control line is selectively turned on.

Further, in the memory mat M(n), a precharge transistor Qp is provided at one end of each of the local bit lines LBL. The precharge transistor Qp supplies the precharge voltages VBLPE/VBLPO to the local bit line LBL in response to the bit line equalizing signal BLEQ applied to its gate. In the sub-mat SM(1) of FIG. 4, the precharge voltage VBLPO is supplied to even-numbered local bit lines LBL(E1) and the precharge voltage VBLPE is supplied to odd-numbered local bit lines LBL(O1), through the precharge transistors Qp. On the other hand, in the sub-mat SM(2) of FIG. 4, the precharge voltage VBLPE is supplied to even-numbered local bit lines LBL(E2) and the precharge voltage VBLPO is supplied to odd-numbered local bit lines LBL(O2), through the precharge transistors Qp. Arrangements of other sub-mats SM are such that the precharge voltages VBLPO and VBLPE are alternately supplied to the local bit lines LBL of the same position in accordance with their order. In the embodiment, controls in the normal operation and the test operation have features regarding the precharge operation using the precharge transistors Qp, which will be described in detail later.

Figure 5:
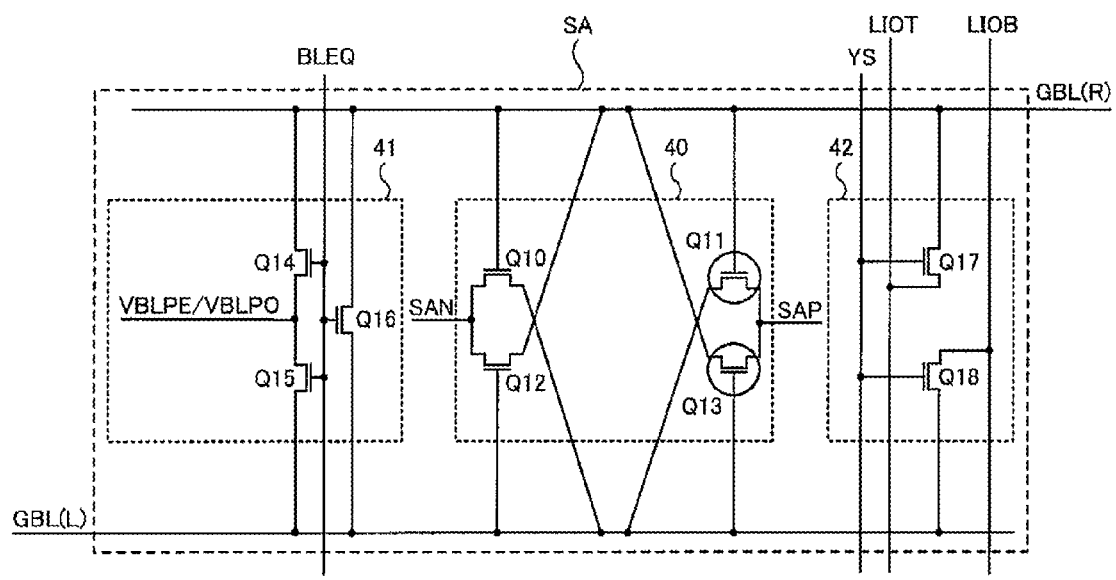
FIG. 5 is a diagram showing a circuit configuration example of a sense amplifier SA of FIG. 4.

FIG. 5 shows a circuit configuration example of the sense amplifier SA of FIG. 4. The sense amplifier SA shown in FIG. 5 is connected to one global bit line GBL(R) in the memory mat M on the right side and one global bit line GBL(L) in the memory mat M on the left side, and a pair of these global bit lines GBL(L) and GBL(R) forms a complementary pair. Taking the sense amplifier SA(E) on the left side in FIG. 4 as an example, the global bit lines GBL(L) and GBL(R) of FIG. 5 correspond to the global bit lines /GBL(E) and GBL(E) of FIG. 4, respectively. The sense amplifier SA includes a cross-coupled circuit 40, a precharge/equalizing circuit 41, an input/output circuit 42, and a pair of local input/output lines LIOT and LIOB.

The cross-coupled circuit 40 includes an inverter composed of a pair of transistors Q10 and Q11 and an inverter composed of a pair of transistors Q12 and Q13, and functions as a latch circuit in which inputs and outputs of the two inverters are cross-coupled to each other. The cross-coupled circuit 40 is activated by the pair of sense amplifier control signals SAN and SAP supplied from the sense amplifier controller 35 (FIG. 3), and determines and latches a voltage difference between the global bit lines GBL(R) and GBL(L) in binary.

The precharge/equalizing circuit 41 includes three transistor Q14, Q15 and Q16 switched by the bit line equalizing signal BLEQ. The transistors Q14 and Q15 function as a precharge circuit that precharges the global bit lines GBL(R) and GBL(L) to the precharge voltage VBLPE and VBLPO, respectively, when the bit line equalizing signal BLEQ is at a high level. The transistor Q16 functions as an equalizing circuit that equalizes potentials of the pair of global bit lines GBL(R) and GBL(L) when the bit line equalizing signal BLEQ is at the high level.

The input/output circuit 42 includes a pair of transistors Q17 and Q18 that control connection states between the pair of global bit lines GBL(L) and GBL(R) and the pair of local input/output lines LIOT and LIOB in accordance with a potential of a column selection line YS. The potential of the column selection line YS is controlled based on the column address stored in the column address buffer 14. When the column selection line YS is set to a high level, the global bit line GBL(R) is connected to the local input/output line LIOT through the transistor Q17 and the global bit line GBL(L) is connected to the local input/output line LIOB through the transistor Q18.

Here, in FIG. 4, the sense amplifiers SA(E) and SA(O) included in the sense amplifier arrays SAA on both sides of the memory mat M(n) have a difference from each other only in the precharge voltages VBLPE and VBLPO supplied to the transistors Q14 and Q15. That is, the precharge voltage VBLPE is supplied to the sense amplifier SA(E) while the precharge voltage VBLPO is supplied to the sense amplifier SA(O), and other points are common between them.

Figure 6:
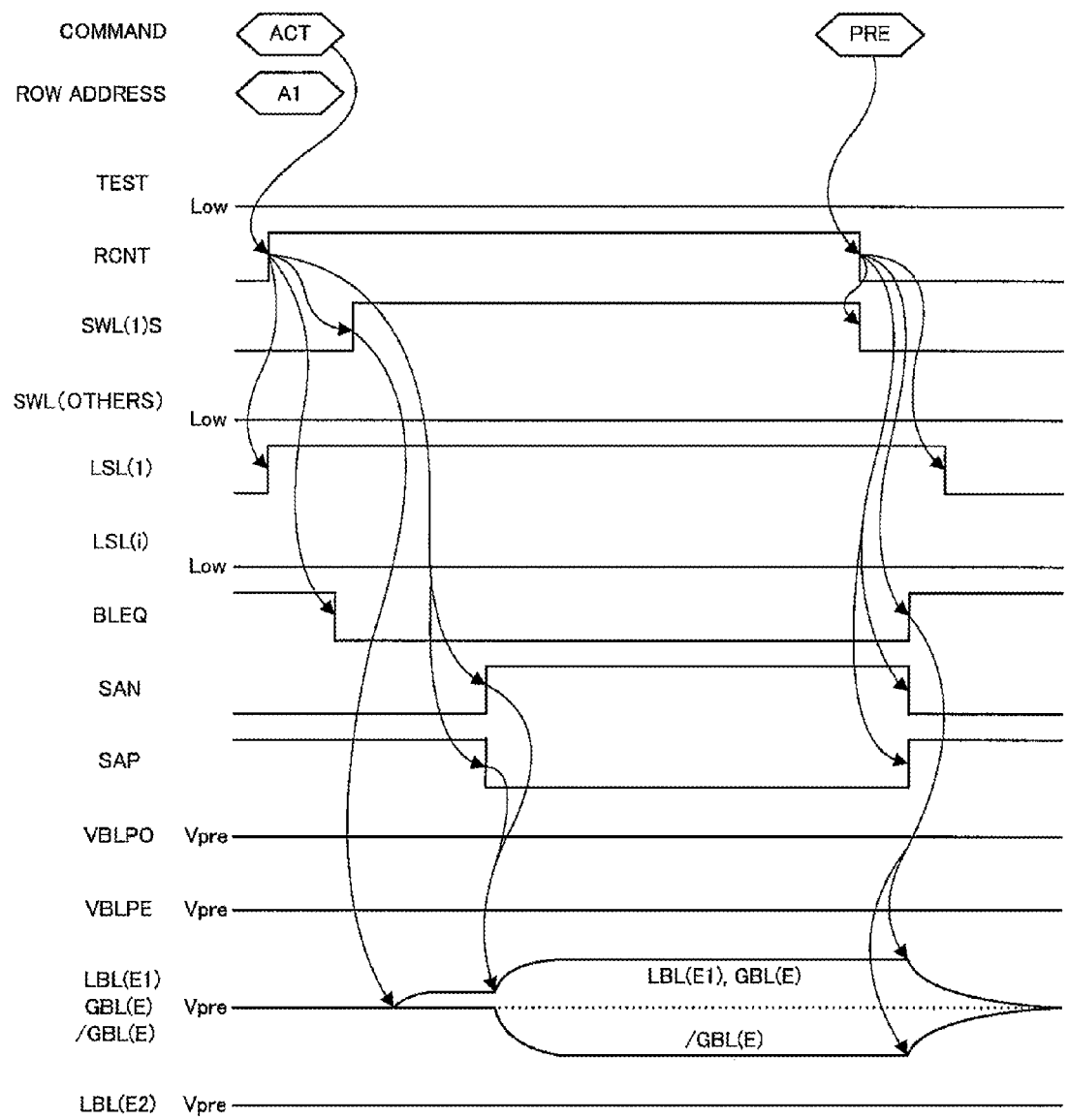
FIG. 6 is operation waveform diagram in a normal operation of the DRAM of the embodiment.
Figure 7:
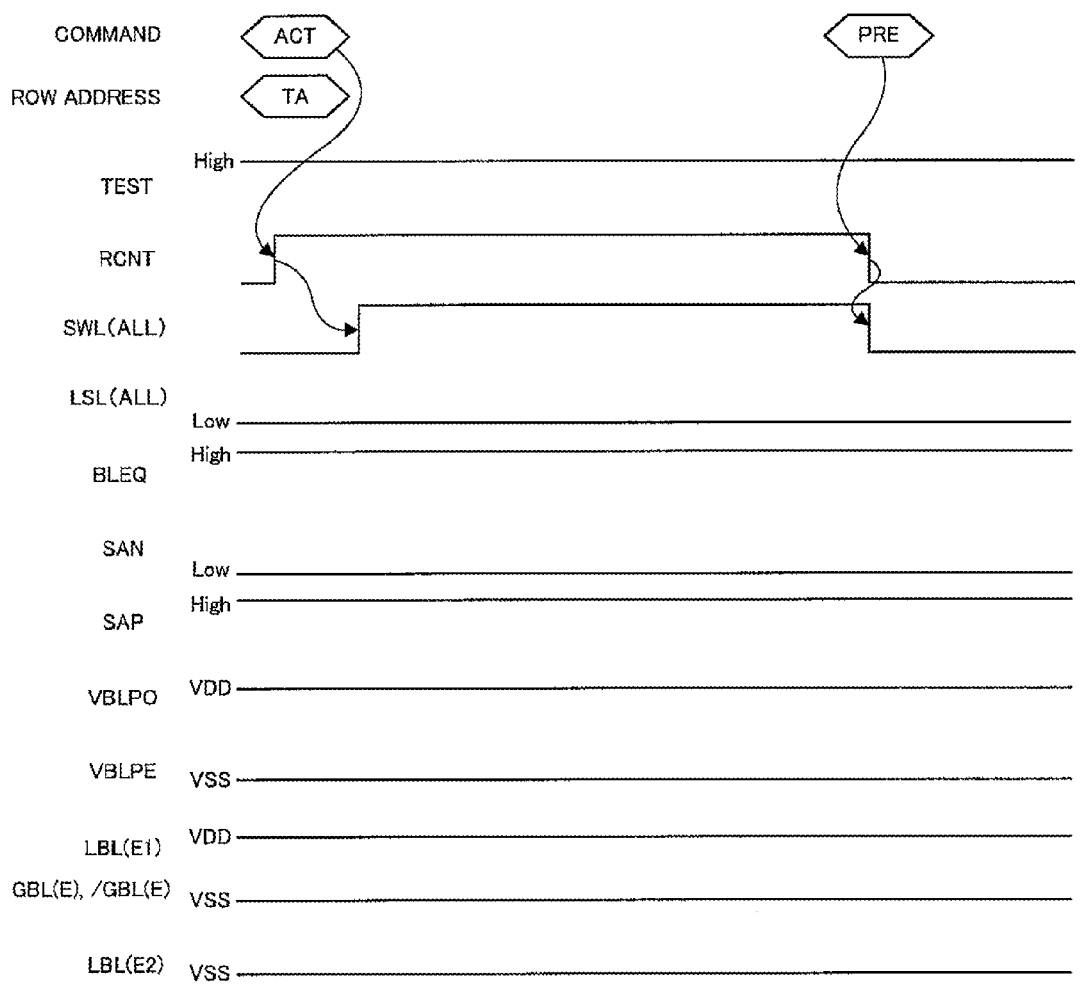
FIG. 7 is operation waveform diagram in a test operation of the DRAM of the embodiment.

Next, an operation of the DRAM of an embodiment will be described with reference to FIGS. 6 and 7. Regarding the DRAM of this embodiment, FIG. 6 shows operation waveforms in the normal operation, and FIG. 7 shows operation waveforms in the test operation. Each of FIGS. 6 and 7 includes operation waveforms of the pair of global bit lines GBL(E) and /GBL(E) connected to one sense amplifier SA(E) in the sense amplifier array SAA between the two sub-mats SM(N) and SM(1) on the left side in FIG. 4, operation waveforms of corresponding local bit lines LBL(E1) and LBL(E2) in the two sub-mats SM(N) and SM(1) that are adjacent to each other in the memory mat M(n), and operation waveforms of other related signals.

The operation shown in FIG. 6 is assumed to be, for example, a read operation to read data of a memory MC selected in the sub-mat SM(1). Initially, when the normal operation of the DRAM is started in FIG. 6, the bit line equalizing signal BLEQ is at the high level, and the pair of global bit lines GBL(E) and /GBL(E) and the local bit lines LBL(E1) and LBL(E2) have been respectively precharged to the predetermined precharge voltage Vpre. At this point, the precharge voltages VBLPE and VBLPO of FIGS. 4 and 5 are controlled to satisfy VBLPE=VBLPO=Vpre (=Vref) by the precharge voltage generating circuit 20.

Subsequently, an active command ACT is issued, and at the same time a row address A1 for designating an access target is received. Thereby, the row control signal RCNT (FIG. 3) is activated to the high level, which enables the row control circuit 31 (FIG. 3) to perform control. As a result, a local switch control line LSL(1) in the sub-mat SM(1) is set to the high level by the hierarchical switch controller 33, and a corresponding switch transistor Qs is turned on so that the local bit line LBL(E1) to be accessed is connected to the global bit lines GBL(E). At this point, respective local switch control lines LSL(i) within a range i=2 to N are maintained in an inactive state (low level). Thereafter, the bit line equalizing signal BLEQ is set to the low level by the memory mat controller 34 so that the above precharge state is cancelled.

Subsequently, one sub-word line SWL(1)S selected in the sub-mat SM(1) is driven to the high level by the word driver 32, and the memory cell MC to be accessed is coupled to the above local bit line LBL(E1). As a result, read data from the memory cell MC allows the potential of the local bit line LBL(E1) to rise to a predetermined level, and the potential of the global bit line GBL(E) also rises through the switch transistor Qs. At this point, sub-word lines SWL other than the one sub-word line SWL(1)S are maintained in a non-selected state (low level). Here, in FIG. 6, high-level data "1" is assumed to be previously stored in the memory cell MC to be accessed.

Thereafter, the sense amplifier control signals SAN and SAP are inverted, respectively, and the sense amplifier SA(E) is activated. As a result, an amplification operation of the sense amplifier SA(E) allows both potentials of the local bit line LBL(E1) and the global bit line GBL(E) to rise to the high level, and allows the potential of the complementary global bit line /GBL(E) to drop to the low level. At this point, the high-level data is latched in the cross-coupled circuit 40 of the sense amplifier SA(E).

Subsequently, a precharge command PRE is issued after a lapse of a predetermined time. Thereby, the row control signal RCNT is set to the low level, and the sub-word line SWL(1)S is returned to the non-selected state (low level). Thus, the row control circuit 31 is returned to the initial control state, the bit line equalizing signal BLEQ is set to the high level, and at the same time the sense amplifier control signals SAN and SAP are inverted again so that the sense amplifier SA(E) is deactivated. As a result, respective potentials of the pair of global bit lines GBL(E) and /GBL(E) and the local bit line LBL(E1) converge to the precharge voltage Vpre. Meanwhile, the local switch control line LSL(1) is returned to the low level, and a corresponding switch transistor Qs is turned off so that the local bit line LBL(E1) to be accessed is disconnected from the global bit line GBL(E).

Next, the test operation shown in FIG. 7 is assumed to be, for example, a wafer-level burn-in that is performed at a stage of a wafer test of the DRAM by applying voltage stresses to the array area 10. Initially, when the test operation of the DRAM is started in FIG. 7, levels of the precharge voltages VBLPE and VBLPO of FIGS. 4 and 5 are different from those of FIG. 6. That is, the precharge voltage generating circuit 20 of FIG. 2 is controlled to satisfy VBLPO=VDD and VBLPE=VSS. Accordingly, the pair of global bit lines GBL(E)/GBL(E) and the local bit line LBL(E1) have been precharged to the power supply voltage VDD, and the local bit line LBL(E2) has been precharged to the ground potential VSS. Initially, other states in FIG. 7 are the same as those in FIG. 6.

Subsequently, the active command ACT is issued, and at the same time a test address TA for designating a test target is received. Thereby, activation of the row control signal RCNT and control by the row control circuit 31 (FIG. 3) are carried out. At this point, in the test operation of FIG. 7, all local switch control lines LSL in the memory mat M(n) are maintained at the low level, and respective switch transistors Qs have been turned off so that the local bit lines LBL(E1) and LBL(E2) have been disconnected from the global bit line GBL(E), which is different from FIG. 6. Further, the bit line equalizing signal BLEQ is at the high level, and the above precharge state is not cancelled. Further, the sense amplifier control signals SAN and SAP are maintained in the initial state, and the sense amplifier SA(E) is not activated.

Meanwhile, all sub-word lines SWL in the memory mat M(n) are driven to the high level at a predetermined timing, and the respective memory cells MC are coupled to corresponding local bit lines LBL. Accordingly, the power supply voltage VDD is written into all memory cells coupled to one local bit line LBL(E1), and the ground potential VSS is written into all memory cells coupled to the other local bit line LBL(E2). That is, a voltage stress is applied between the two local bit lines LBL(E1) and LBL(E2) that are adjacent to each other in the extending direction of the global bit line GBL by using the power supply voltage VDD and the ground potential VSS, which is also applied to respective memory cells MC thereof. Subsequently, the precharge command PRE is issued after a lapse of a time required for testing. Thereby, all sub-word lines SWL are returned to the non-selected state (low level), and the test operation of FIG. 7 is completed. In this manner, by applying the voltage stress between the two local bit lines LBL(E1) and LBL(E2) adjacent to each other in the extending direction of the global bit lines GEL, the two local bit lines LBL(E1) and LBL(E2) are short-circuited with each other when insulation therebetween is insufficient, thereby exposing insufficient insulation between the local bit lines LBL. Then, it is possible to remove DRAMs having such insufficient insulation as defective products in a subsequent test.

As described above, according to the DRAM of the embodiments, in the test operation, sufficient voltage stress can be applied between two local bit lines LBL adjacent in the extending direction of a corresponding one of the global bit lines GBL. Here, FIG. 7 illustrates a case where the voltage stress is applied to a pair of adjacent local bit lines LBL(E1) and LBL(E2). However, if N local bit lines LBL are arranged, voltages of different levels may be alternately supplied to respective precharge transistors Qp. Thereby, voltage stresses can be applied to all adjacent combinations of the N local bit lines LBL. In this manner, by employing the configuration and control of the embodiments, it is possible to apply the voltage stress to pairs of the local bit lines LBL that are adjacent in the extending direction of the global bit line GBL, respectively, and to easily remove DRAMs having a failure such as insufficient insulation between the local bit lines.

In the foregoing, the present invention has been described based on the embodiments. However the present invention is not limited to the embodiments and can variously be modified without departing the essentials of the present invention. For example, although the power supply voltage VDD and the ground potential VSS are supplied to adjacent local bit lines LBL in the embodiments, voltages of different levels can be supplied thereto in accordance with purposes of the test operation, without being limited to the embodiments. For example, an array voltage obtained by stepping down the power supply voltage VDD may be used. Further, the configuration shown in FIG. 4 is an example, and the present invention can be widely applied to semiconductor devices having various configurations, without being limited to the embodiments.

The invention claimed is:

1. A device comprising:
a first global bit line;
first and second local bit lines coupled in common to the first global bit line;
first and second power lines;
a first transistor coupled between the first local bit line and the first power line;
a second transistor coupled between the second local bit line and the second power line; and
a third transistor coupled between the first and second power lines.

2. The device as claimed in claim 1, wherein the third transistor receives a test signal at a control electrode thereof.

3. The device as claimed in claim 1, further comprising first and second power generators coupled respectively to the first and second power lines.

4. The device as claimed in claim 3, wherein each of the first and second power generators is supplied with first and second power supply voltages, configured to generate a precharge voltage and configured to supply one of the first and second power supply voltages and the precharge voltage to a corresponding one of the first and second power lines.

5. The device as claimed in claim 4, further comprising a reference voltage generator configured to produce a reference voltage and to supply the reference voltage in common to the first and second power generator, and wherein each of the power generators generates the precharge voltage in response to the reference voltage.

6. The device as claimed in claim 4, wherein the precharge voltage is substantially half level between the first and second power supply voltages.

7. The device as claimed in claim 3, wherein the third transistor receives a test signal at a control electrode thereof and each of the first and second power generators receives the test signal.

8. The device as claimed in claim 1, wherein each of the first global bit line and the first and second local bit lines extends in a first direction and the first and second local bit lines are arranged in the first direction to each other.

9. The device as claimed in claim 1, further comprising a first switch transistor coupled between the first global bit line and the first local bit line and a second switch transistor coupled between the first global bit line and the second local bit line.

10. The device as claimed in claim 1, further comprising a second global bit line and a sense amplifier coupled between the first and second global bit lines.

11. The device as claimed in claim 1, further comprising first and second power generators coupled respectively to the first and second power lines, and wherein each of the first and second power generators is supplied with first and second power supply voltages, configured to produce a precharge voltage, and the sense amplifier includes a precharge circuit configured to make the first and second global bit lines the precharge voltage.

12. The device as claimed in claim 11, wherein the precharge voltage is substantially half level between the first and second power supply voltages.

13. The device as claimed in claim 1, further comprising;
a second global bit line, and
third and fourth local bit lines coupled in common to the second global bit line, and
wherein each of the first and second global bit lines and the first, second, third and fourth local bit lines extends in a first direction, the first and second global bit lines are arranged in a second direction that crosses the first direction, the first and third local bit lines are arranged in the second direction, the second and fourth local bit lines arranged in the second direction, and the device further comprises,
a third transistor coupled between the third local bit line and the second power line, and
a fourth transistor coupled between the fourth local bit line and the first power line.

14. A device comprising:
a first global bit line;
first and second local bit lines coupled in common to the first global bit line;
a first precharge circuit configured to supply a first precharge voltage to the first local bit line;
a second precharge circuit configured to supply a second precharge voltage to the second local bit line; and
a precharge voltage generator configured to make the first and second precharge voltages different in level from each other.

15. The device as claimed in claim 14, wherein each of the first global bit line and the first and second local bit lines extends in a first direction and the first and second local bit lines are arranged in the first direction to each other.

16. The device as claimed in claim 14, further comprising a first switch transistor coupled between the first global bit line and the first local bit line and a second switch transistor coupled between the first global bit line and the second local bit line.

17. The device as claimed in claim 15, further comprising a first power line coupled to the precharge voltage generator and configured to be supplied with the first precharge voltage, and a second power line coupled to the precharge voltage generator and configured to be supplied with the second precharge voltage, and wherein the first precharge circuit includes a first transistor coupled between the first local bit line and the first power line and the second precharge circuit includes a second transistor coupled between the second local bit line and the second power line.

18. The device as claimed in claim 17, wherein the precharge voltage generator includes a third transistor coupled between the first and second power lines and configured to receive a test signal at a control electrode thereof.

19. The device as claimed in claim 14, wherein the precharge voltage generator configured to make the first and second precharge voltages different in level from each other when a test signal takes a first logic level and configured to make the substantially the same voltage level to each other when the test signal takes a second logic level different from the first voltage level.

20. The device as claimed in claim 19, further comprising; a first switch transistor coupled between the first global bit line and the first local bit line, a second switch transistor coupled between the first global bit line and the second local bit line, and a switch control circuit configured to make both of the first and second switch transistors nonconductive when the test signal takes the first logic level.

\* \* \* \* \*